(12) United States Patent
Fuchigami

(10) Patent No.: US 10,930,638 B2
(45) Date of Patent: Feb. 23, 2021

(54) SEMICONDUCTOR DEVICE HAVING OVERLAPPING RESISTANCE ELEMENT AND CAPACITOR

(71) Applicant: LAPIS Semiconductor Co., Ltd., Yokohama (JP)

(72) Inventor: Chikashi Fuchigami, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/253,227

(22) Filed: Jan. 22, 2019

(65) Prior Publication Data

US 2019/0229107 A1 Jul. 25, 2019

(30) Foreign Application Priority Data

Jan. 22, 2018 (JP) .............................. JP2018-007919

(51) Int. Cl.
| | |
|---|---|
| *H01L 27/02* | (2006.01) |
| *H01L 27/06* | (2006.01) |
| *H01L 23/52* | (2006.01) |
| *H01L 23/60* | (2006.01) |
| *H01L 23/64* | (2006.01) |
| *H01L 23/522* | (2006.01) |

(Continued)

(52) U.S. Cl.
CPC ........ *H01L 27/0248* (2013.01); *H01L 23/528* (2013.01); *H01L 23/5223* (2013.01); *H01L 23/5226* (2013.01); *H01L 23/5228* (2013.01); *H01L 23/60* (2013.01); *H01L 23/642* (2013.01); *H01L 27/0629* (2013.01); *H01L 27/0682* (2013.01); *H01L 28/20* (2013.01); *H01L 28/40* (2013.01)

(58) Field of Classification Search
CPC ............. H01L 27/0248; H01L 27/0629; H01L 27/0682; H01L 23/5223; H01L 23/5226; H01L 23/5228; H01L 23/528; H01L 23/60; H01L 23/642; H01L 28/20; H01L 28/40
See application file for complete search history.

(56) References Cited

U.S. PATENT DOCUMENTS 5,903,033 A * 5/1999 Suwa .................. H01L 29/8605
257/358
6,066,537 A * 5/2000 Poh ..................... H01L 23/5223
257/E21.008

(Continued)

FOREIGN PATENT DOCUMENTS

JP 2016111186 6/2016

*Primary Examiner* — Ida M Soward
(74) *Attorney, Agent, or Firm* — JCIPRNET

(57) ABSTRACT

The disclosure provides a semiconductor device that can reduce the area of the circuit elements formed thereon. The semiconductor device includes a first conductivity type region formed on a substrate and formed with a resistance element surrounded by an insulating film; a second conductivity type region laminated in contact with an upper surface of the resistance element; a capacitor formed on the resistance element via an interlayer insulating layer; a via electrically connecting a terminal of the resistance element and a terminal of the capacitor in series; and a power supply line and a ground line electrically connected to the other terminal of the resistance element and the other terminal of the capacitor respectively.

5 Claims, 3 Drawing Sheets

(51) Int. Cl.
*H01L 23/528* (2006.01)
*H01L 49/02* (2006.01)

(56) References Cited

U.S. PATENT DOCUMENTS

| | | | | |
|---|---|---|---|---|
| 6,329,260 B1* | 12/2001 | DeJong | ............... | G05F 3/262 |
| | | | | 257/E27.015 |
| 6,573,588 B1* | 6/2003 | Kumamoto | ............. | H01L 29/92 |
| | | | | 257/371 |
| 6,584,031 B2* | 6/2003 | Fujisawa | ................ | G11C 5/147 |
| | | | | 365/189.09 |
| 7,652,917 B2* | 1/2010 | Oka | ................... | G11C 16/0433 |
| | | | | 257/316 |
| 8,417,196 B2* | 4/2013 | Kitching | ................... | H03F 3/72 |
| | | | | 455/126 |
| 8,624,322 B1* | 1/2014 | Su | ........................ | H01L 27/0629 |
| | | | | 257/359 |
| 8,860,172 B2* | 10/2014 | Yamaji | ................. | H01L 27/088 |
| | | | | 257/500 |
| 9,305,993 B2* | 4/2016 | Lin | ............................ | G05F 3/02 |
| 9,553,139 B2* | 1/2017 | Onishi | ................ | H01L 27/0629 |
| 9,613,968 B2* | 4/2017 | Luan | ..................... | H01L 29/742 |
| 9,621,033 B2* | 4/2017 | Choy | ...................... | H02M 3/07 |
| 9,673,187 B2* | 6/2017 | Salcedo | .............. | H01L 27/0259 |
| 9,761,295 B2* | 9/2017 | Bill | .......................... | G11C 5/06 |
| 9,825,028 B2* | 11/2017 | van Iersel | ........... | H03M 1/0614 |
| 10,217,861 B2* | 2/2019 | Yamaji | ................ | H01L 29/1095 |
| 2002/0140109 A1* | 10/2002 | Keshavarzi | ......... | H01L 27/0805 |
| | | | | 257/782 |
| 2006/0151851 A1* | 7/2006 | Pillai | ....................... | H01L 24/05 |
| | | | | 257/531 |
| 2007/0194390 A1* | 8/2007 | Chinthakindi | ...... | H01L 27/0802 |
| | | | | 257/379 |
| 2008/0013230 A1* | 1/2008 | Suzuki | .................. | H01L 23/585 |
| | | | | 361/56 |
| 2010/0084698 A1* | 4/2010 | Akiyama | ........... | H01L 27/1052 |
| | | | | 257/306 |
| 2010/0133583 A1* | 6/2010 | Mawatari | ........... | H01L 27/0259 |
| | | | | 257/173 |
| 2010/0289120 A1* | 11/2010 | Sato | ...................... | H01L 27/105 |
| | | | | 257/534 |
| 2011/0303947 A1* | 12/2011 | Salcedo | .............. | H01L 27/0259 |
| | | | | 257/173 |
| 2017/0062567 A1* | 3/2017 | Kaya | ................... | H01L 29/7823 |
| 2017/0162558 A1* | 6/2017 | Chu | ..................... | H01L 23/5226 |

* cited by examiner

SEMICONDUCTOR DEVICE HAVING OVERLAPPING RESISTANCE ELEMENT AND CAPACITOR

CROSS-REFERENCE TO RELATED APPLICATION

This application claims the benefit of Japan Application No. 2018-007919, filed on Jan. 22, 2018. The entirety of the above-mentioned patent application is hereby incorporated by reference herein and made a part of this specification.

BACKGROUND

Technical Field

The disclosure relates to a semiconductor device.

Description of Related Art

Japanese Patent Application Laid-Open No. 2016-111186 (Patent Document 1) describes a semiconductor device, which includes a detection circuit detecting a surge that occurs in the power supply line connected to the protected circuit, at least one inverter connected in series with each other, a protection transistor controlled by output of the detection circuit, and a time constant circuit connected to the protection transistor, for protection against electrostatic discharge (ESD).

However, the conventional semiconductor device as described in Patent Document 1 has a drawback that the resistance element and the capacitor constituting the detection circuit are formed side by side on the surface and the area occupied by them are larger than those of other elements on the semiconductor device.

SUMMARY

A semiconductor device of the disclosure includes: a substrate; a first conductivity type region formed on the substrate and formed with a resistance element surrounded by an insulating film; a second conductivity type region laminated in contact with an upper surface of the resistance element; a capacitor formed on the resistance element via an interlayer insulating layer; a via electrically connecting a terminal of the resistance element and a terminal of the capacitor in series; and a power supply line and a ground line electrically connected to the other terminal of the resistance element and the other terminal of the capacitor respectively.

DESCRIPTION OF THE EMBODIMENTS

Figure 1:
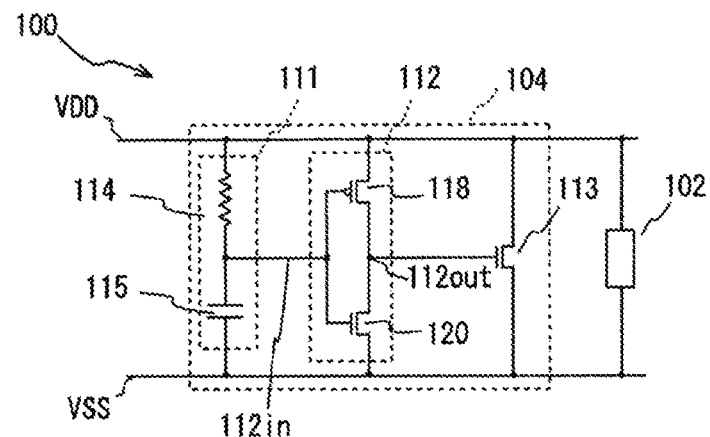
FIG. 1 is a circuit diagram showing an example of a semiconductor integrated circuit according to the semiconductor device, which is an embodiment of the disclosure.

The disclosure was made in view of the above problems and aims to provide a semiconductor device that can reduce the area occupied by the circuit elements formed in the semiconductor device.

According to the semiconductor device of the disclosure, it is possible to arrange the two elements, the resistance element and the capacitor, to overlap each other instead of forming the resistance element and the capacitor side by side on the surface. Therefore, the area occupied by the RC circuit comprising the resistance element and the capacitor can be reduced. Furthermore, the manufacture of the semiconductor device can be realized in a manufacturing process having deep trench isolation structure.

Hereinafter, a semiconductor device of an embodiment according to the disclosure will be described in detail with reference to the drawings. In the embodiment, components that have substantially the same functions and configurations are denoted by the same reference numerals and thus descriptions thereof are not repeated.

FIG. 1 is a circuit diagram showing an example of a semiconductor integrated circuit including an ESD protection circuit according to the semiconductor device of the embodiment. The protection circuit 104 shown in FIG. 1 is provided for ESD protection of a protection target circuit 102 that is connected between a power supply line VDD of the power supply potential and a ground line VSS of the reference potential. As shown in the figure, the conventional semiconductor device 100 includes the protection target circuit 102, which corresponds to the semiconductor integrated circuit, and the protection circuit 104. The protection target circuit 102 has one terminal connected to the power supply line VDD and the other terminal connected to the ground line VSS.

As shown in FIG. 1, the protection circuit 104 includes an RC series circuit 111 connected to the power supply line VDD and the ground line VSS; an inverter circuit 112 connected to the RC series circuit 111, the power supply line VDD, and the ground line VSS; and a protection NMOS transistor 113 connected to the inverter circuit 112, the power supply line VDD, and the ground line VSS.

The RC series circuit 111 is composed of a resistance element 114 connected in series between the power supply line VDD and the ground line VSS, and a capacitor 115 that serves as a capacitive load.

The inverter circuit 112 is a CMOS inverter configured by complementarily arranging a PMOS transistor 118 and an NMOS transistor 120. That is, in the inverter circuit 112, the gate of the PMOS transistor 118 and the gate of the NMOS transistor 120 are connected and the connection point thereof is set as an input terminal 112in, and the drain of the PMOS transistor 118 and the drain of the NMOS transistor 120 are connected and the connection point thereof is set as an output terminal 112out. The connection point of the resistance element 114 and the capacitor 115 of the RC series circuit 111 is connected to the input terminal 112in.

The gate of the protection NMOS transistor 113 is connected to the output terminal 112out of the inverter circuit 112, the drain is connected to the power supply line VDD, and the source is connected to the ground line VSS.

When a voltage of a high voltage waveform (hereinafter referred to as "surge voltage") caused by ESD is applied, the RC series circuit 111, the inverter circuit 112, and the protection NMOS transistor 113 operate as follows. That is, when the surge voltage (a rapidly rising high voltage) that sets the side of the power supply line VDD positive is applied between the power supply line VDD and the ground line VSS due to ESD discharge, the potential of the input terminal 112in rises later than the rise of the surge voltage. The delay depends on a time constant of the RC series circuit 111. If the time constant of the RC series circuit 111 is sufficiently large, the potential of the input terminal 112in is kept lower than a threshold of the inverter circuit 112, the NMOS transistor 120 of the inverter circuit 112 is kept off, and the PMOS transistor 118 is kept on until the application of the surge voltage is finished. As a result, the voltage of the power supply line VDD is applied to the gate of the protection NMOS transistor 113, and the protection NMOS transistor 113 is kept on while the surge voltage is applied. For example, the duration of the ESD discharge is 5 nanoseconds to hundreds of nanoseconds.

In the semiconductor device 100 configured as described above, when the surge voltage is applied to the power supply line VDD or the ground line VSS, the protection circuit 104 operates to eliminate the potential difference between the power supply line VDD and the ground line VSS with the surge voltage as a trigger. Therefore, the protection target circuit 102 is protected.

Although one inverter circuit is connected in the example of FIG. 1, the number of the inverter circuits is not necessarily one and may be three or an odd number larger than three (when the protection transistor is an NMOS transistor). Moreover, in a modified example of the example of FIG. 1, when the protection transistor is a PMOS transistor, for example, the number of the inverter circuits may be two or an even number larger than two.

Figure 2:
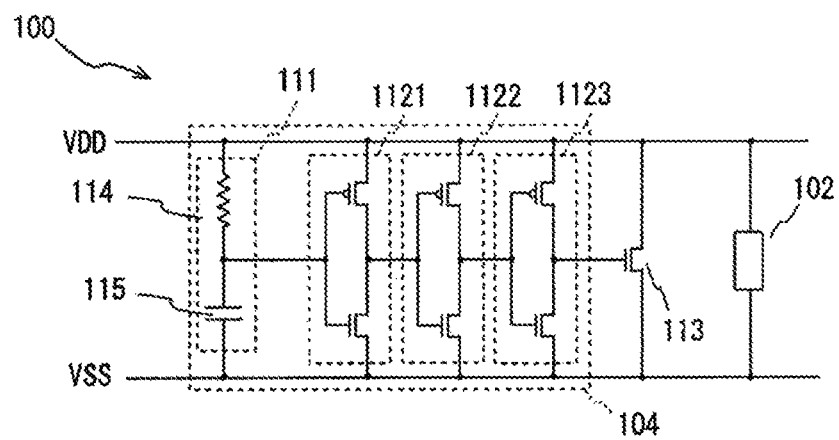
FIG. 2 is a circuit diagram showing a semiconductor integrated circuit according to a modified example of the present embodiment.

As shown in FIG. 2, when the power supply line VDD is held by the power supply voltage VDD, since the RC series circuit 111 (capacitor 115) is in a high impedance state, the potential of the input terminal 112in that connects the resistance element 114 and the capacitor 115 is at a substantially high level (VDD). Since this high level is applied to the input of the first inverter circuit 1121 which is the first stage of the three inverters, its output is at a low level (VSS). The output (low level) of the first inverter circuit 1121 establishes the outputs of the second inverter circuit 1122 and the third inverter circuit 1123. At this time, the output of the second inverter circuit 1122 is at a high level and the output of the third inverter circuit 1123 is at a low level.

Accordingly, the gate of the protection NMOS transistor 113 is at a low level (VSS) at this time, so the channel of the protection NMOS transistor 113 is closed. Thus, no current flows from the power supply line VDD applied with the power supply voltage VDD to the ground line VSS applied with the reference potential VSS.

The following describes that, in the semiconductor device of the present embodiment, the resistance element 114 and the capacitor 115 (RC series circuit 111) are arranged to overlap each other instead of being formed side by side on the surface.

Figure 3:
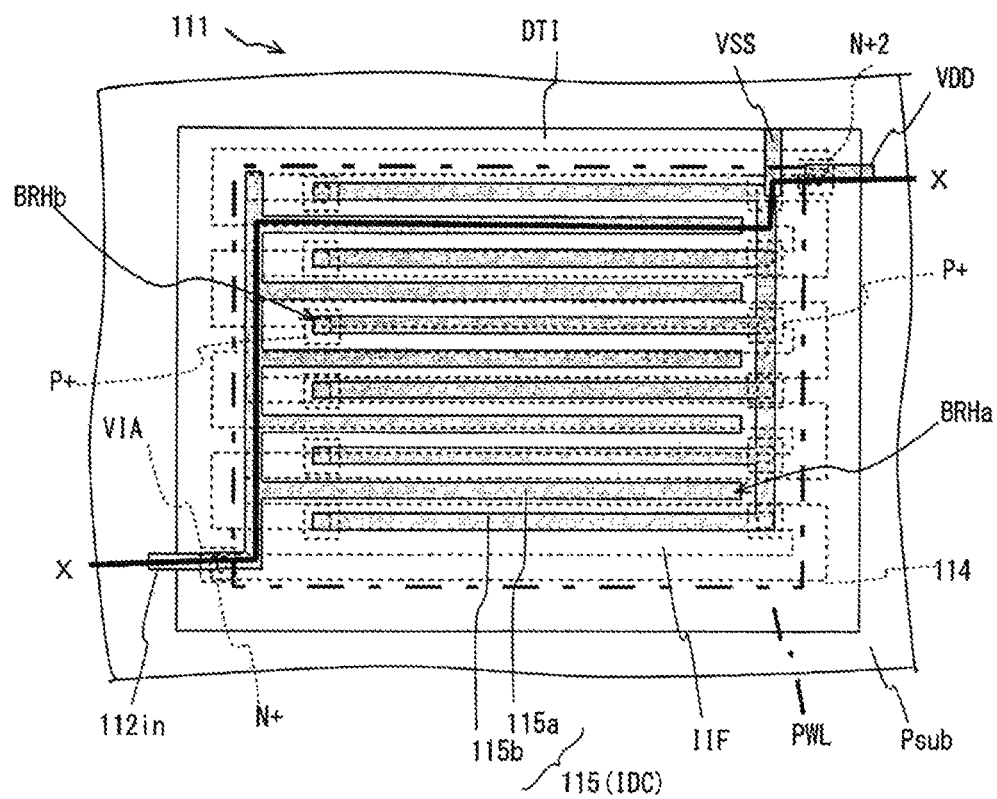
FIG. 3 is a partial plan view of a part corresponding to the RC circuit of the semiconductor device according to the present embodiment.

As shown in the partial plan view of the part corresponding to the RC series circuit 111 in FIG. 3, the resistance element 114 surrounded by an insulating film IIF (silicon oxide film) is formed as an N-type well region NWL which is formed on a P-type semiconductor substrate Psub and is a first conductivity type region. The N-type well region NWL can be formed by ion-implanting an N-type impurity (for example, phosphorus) into the surface layer of the semiconductor substrate Psub via a predetermined mask opening. The resistance element 114 may be formed by performing dry etching with a predetermined pattern for the insulating film IIF to dig a trench and filling an insulator in the trench.

Figure 4:
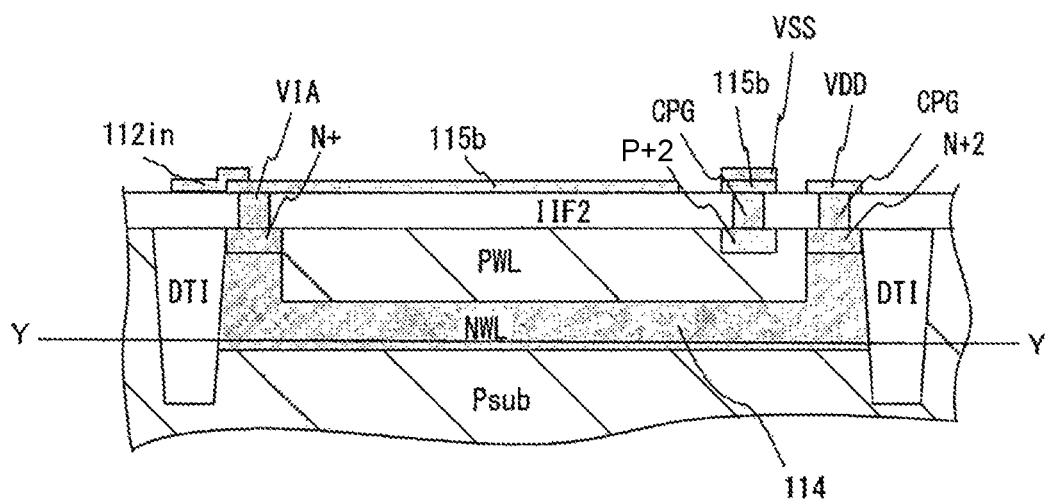
FIG. 4 is a partial cross-sectional view taken along the line XX of FIG. 3.

As shown in FIG. 4, on the upper surface of the resistance element 114, a P-type well region PWL, which is a second conductivity type region laminated in contact therewith is disposed. The P-type well region PWL can be formed by depositing a polysilicon film on the resistance element 114 (N-type well region NWL), forming the polysilicon film, and ion-implanting a P-type impurity (for example, boron) at a high concentration into the surface layer thereof via a predetermined mask opening pattern.

The capacitor 115 is formed of a metal film on the resistance element 114 via an interlayer insulating layer IIF2 (silicon oxide film).

As shown in FIG. 3, the capacitor 115 comprises a pair of metal comb-shaped electrodes 115a and 115b to serve as an interdigital capacitor IDC. The comb-shaped electrodes 115a and 115b are branched. The comb-shaped electrodes 115a and 115b face each other with their teeth BRHa and BRHb meshing with each other via a gap part. Capacitance is held by the comb-shaped electrodes 115a and 115b.

One terminal (N-type dopant high concentration diffusion region N+) of the resistance element 114 and one terminal (comb-shaped electrode 115a) of the capacitor 115 are electrically connected in series by a via VIA.

The other terminal (N-type dopant high concentration diffusion region N+2) of the resistance element 114 is electrically connected to the power supply line VDD via a contact plug CPG.

In addition, the other terminal (comb-shaped electrode 115b) of the capacitor 115 is electrically connected to the ground line VSS. The comb-shaped electrode 115b of the capacitor 115 is connected to the P-type well region PWL via the contact plug CPG and the P-type dopant high concentration diffusion region P+2 at the tip and the root of each tooth BRHa.

Figure 5:
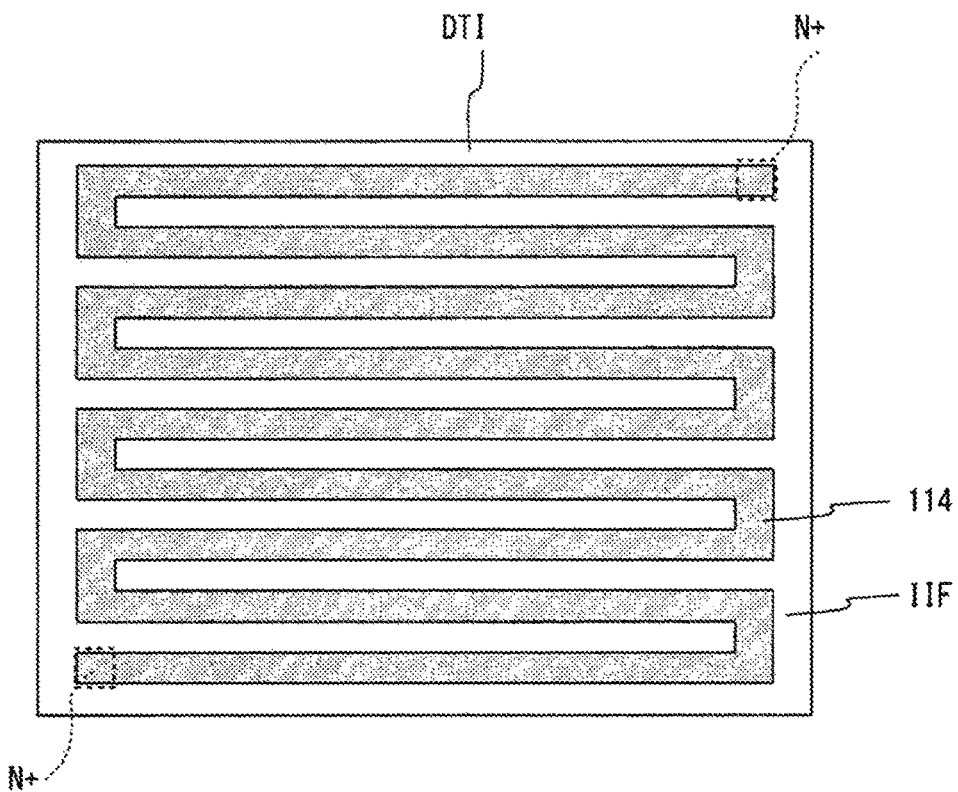
FIG. 5 is a partial cross-sectional plan view taken along the line YY of FIG. 4.

As shown in FIG. 5, the resistance element 114 is a microstrip formed continuous from one terminal to the other terminal (N+ to N+2) and is disposed in a zigzag manner between the P-type semiconductor substrate Psub and the P-type well region PWL.

As shown in FIG. 3 and FIG. 4, the via VIA is connected as the input side of the input terminal 112in of the inverter circuit 112 (FIG. 1).

An annular insulator trench DTI is disposed in contact with the side surfaces of both of the resistance element 114 (N-type well region NWL) and the P-type well region PWL to surround both of them.

According to the semiconductor device of the present embodiment, it is possible to arrange the resistance element 114 (zigzag manner) and the capacitor 115 to overlap each other in the film thickness direction through the manufacturing process for deep trench isolation, instead of forming the resistance element and the capacitor side by side on the substrate surface. Therefore, the area occupied by the RC circuit can be reduced.

Figure 6:
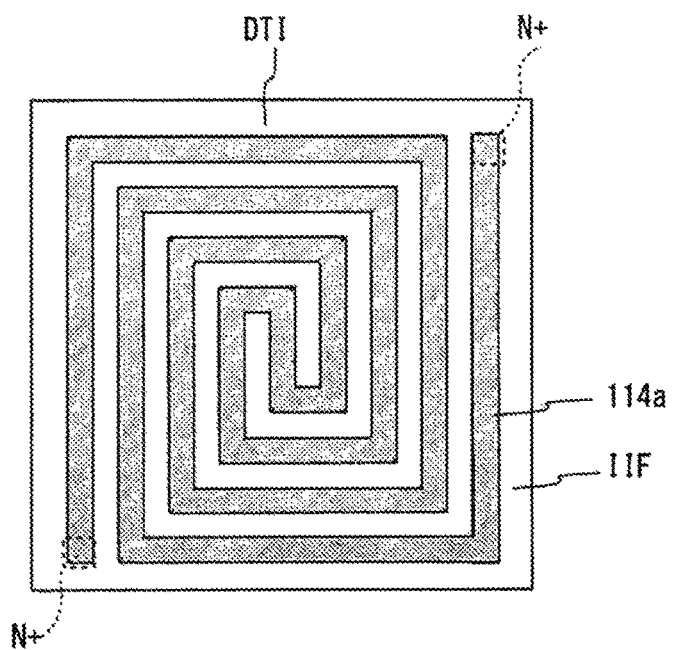
FIG. 6 is a partial cross-sectional plan view showing the resistance element according to a modified example of the present embodiment.

According to a modified example of the semiconductor device of the present embodiment, as shown in FIG. 6, the microstrip of the resistance element 114 can be changed to a resistance element 114a having a spiral shape, other than the zigzag manner, to be arranged between the P-type semiconductor substrate Psub and the P-type well region PWL.

What is claimed is:

1. A semiconductor device, comprising:
   a substrate having a first conductivity type region that is formed on the substrate and has a resistance element surrounded by an insulating film and a second conductivity type region that is laminated in contact with an upper surface of the resistance element;
   a capacitor formed on the resistance element via an interlayer insulating layer;
   a via electrically connecting a terminal of the resistance element and a terminal of the capacitor in series; and
   a power supply line and a ground line electrically connected to an other terminal of the resistance element and an other terminal of the capacitor respectively.

2. The semiconductor device according to claim 1, wherein the resistance element is a microstrip formed continuous from the terminal to the other terminal and is arranged in a zigzag manner between the substrate and the second conductivity type region.

3. The semiconductor device according to claim 1, wherein the capacitor is an interdigital capacitor comprising a pair of comb-shaped electrodes facing each other via a gap part formed on the interlayer insulating layer.

4. The semiconductor device according to claim 3, further comprising:
   at least one inverter circuit connected as an input side to the via and respectively connected to the power supply line and the ground line between the power supply line and the ground line; and
   a protection circuit connected to an output side of the inverter circuit.

5. The semiconductor device according to claim 1, further comprising:
   an annular insulator trench arranged in contact with side surfaces of both of the resistance element and the second conductivity type region to surround the resistance element and the second conductivity type region.

* * * * *